United States Patent
Allstrom

(10) Patent No.: US 6,226,324 B1
(45) Date of Patent: May 1, 2001

(54) METHODS AND SYSTEMS FOR TRIMMING A PWM SIGNAL

(75) Inventor: Peter Edward Allstrom, Attleboro, MA (US)

(73) Assignee: The Foxboro Company, Foxboro, MA (US)

( * ) Notice: Subject to any disclaimer, the term of this patent is extended or adjusted under 35 U.S.C. 154(b) by 0 days.

(21) Appl. No.: 08/992,590

(22) Filed: Dec. 17, 1997

(51) Int. Cl.$^7$ ................................................ H03K 7/08
(52) U.S. Cl. ............................................ 375/238; 332/109
(58) Field of Search ........................... 375/238, 239; 370/212; 332/109; 327/31, 37, 175, 176, 172

(56) References Cited

U.S. PATENT DOCUMENTS

| | | | |
|---|---|---|---|
| 3,706,943 | 12/1972 | Owen | 332/9 |
| 4,272,760 | 6/1981 | Williams | 340/347 |
| 4,321,832 | 3/1982 | Runyan | 73/708 |
| 4,446,527 | 5/1984 | Runyan | 364/558 |
| 4,592,002 | 5/1986 | Bozarth et al. | 364/571 |
| 4,965,504 | 10/1990 | Ueda et al. | 318/802 |
| 4,967,385 | 10/1990 | Thomas | 364/571.03 |
| 5,038,094 * | 8/1991 | Rashid | 322/28 |
| 5,134,398 | 7/1992 | Yabara | 341/119 |
| 5,144,265 | 9/1992 | Petzold | 332/109 |
| 5,295,158 | 3/1994 | Jordan | 375/22 |
| 5,432,830 * | 7/1995 | Bonnet | 417/41 |
| 5,594,441 | 1/1997 | Coleman, Jr. | 341/136 |
| 5,793,808 * | 8/1998 | Rowe et al. | 375/238 |
| 6,072,361 * | 6/2000 | Myers et al. | 330/10 |

* cited by examiner

Primary Examiner—Chi Pham
Assistant Examiner—Kevin M Burd
(74) Attorney, Agent, or Firm—David Barron; Jules Jay Morris; Terrence Martin

(57) ABSTRACT

A pulse width modulation ("PWM") generation circuit is described. The circuit includes a main PWM generator, a trimming signal generator, and a summer. The main PWM signal generator generates a main PWM output which is modified by the summer in accordance with a trimming signal produced by the trimming signal generator. In particular, the main PWM signal may be lengthened, shortened, or preserved by the summer circuit. Accordingly, the main PWM signal is trimmable, without direct modification thereof by using the trimming signal generator.

24 Claims, 7 Drawing Sheets

METHODS AND SYSTEMS FOR TRIMMING A PWM SIGNAL

TECHNICAL FIELD

The present invention relates, in general, to pulse width modulation ("PWM") circuitry. More specifically, the present invention relates to methods and systems for trimming a PWM signal.

BACKGROUND OF THE INVENTION

Many circuits use PWM techniques for a variety of purposes. In one example, a PWM output provides a signal source for receipt by another device. By varying, for example, the frequency and duty cycle of the PWM signal, control of the other device can be affected. One particular example is in the field of motor control. A PWM signal can be used to drive (through appropriate current-drive circuitry) a motor. By varying the duty cycle of the PWM signal, the amount of energy transferred to the motor is changed. This is useful in regulating motor torque and speed. In another example, the PWM signal is passed through a low-pass filter, thereby producing a filtered analog voltage output that varies as a function of the duty cycle of the PWM signal.

By way of definition and background, a PWM (pulse width modulated) signal is one in which the information is contained in the width of each pulse, typically of a repeating string of pulses. It is considered a form of analog signal in that the information is contained in the time duration of a pulse, which is varied continuously, or in such small steps as to be effectively continuous. That is to be contrasted with a digital signal in which information is contained in discrete steps (such as two steps for binary) and in which values are assigned to the various discrete combinational possibilities.

Generally, a set of digital data stored in registers controls the PWM signal parameters such as, for example, duty cycle and frequency. Thus, to alter the duty cycle of the PWM signal, the data value in the appropriate "duty cycle" register is altered. However, it may be desirable to "trim", or adjust (i.e., lengthen or shorten) the PWM duty cycle without altering the main stored digital duty cycle data value. For example, it may be desirable to trim the duty cycle as a function that is independent of the function which controls the main duty cycle data value.

The present invention is directed toward solutions to the above-identified problem.

SUMMARY OF THE INVENTION

Briefly described, in a first aspect, the present invention includes a PWM generation circuit that includes a main PWM signal generator, a trimming signal general and a summer. The main PWM signal generator includes a main PWM output, while the trimming signal generator includes a trimming output which produces pulses. The summer includes a first input connected to the main PWM output, a second input connected to the trimming output of the trimming signal generator, and a trimmed PWM output. In particular, the trimmed PWM output has a duty cycle of the main PWM output modified as a function of the trimming output.

As an enhancement, the trimming signal generator may include a trimming value input for receiving a trimming value that controls a frequency of the pulses produced by the trimming signal generator. The trimming value may be a function of a measured parameter comprising, for example, temperature.

The circuit may also include a lookup table having an index input and a table data output. In particular, the table data output is coupled to the trimming value input of the trimming signal generator. The lookup table thereby controls the trimming signal generator as a function of the data on the index input and the contents the lookup table. Further, a buffer may couple the lookup table to the trimming signal generator to facilitate table reloading without affecting the trimming signal generator.

As a further enhancement, the PWM generation circuit may extent, preserve, or shorten the duty cycle of the main PWM output in generating the trimmed PWM output. Accordingly, and in particular regard to the summer, it may include at least on counter logically coupled to the trimming output, the main PWM output, and the trimmed PWM output such that the counter records the pulses during an on time of the main PWM output. The summer thereby controls the extending, preserving or shortening of the trimmed PWM output. The at least one counter may be, for example, a synchronous up/down counter or a pair of asynchronous up counters in alternate embodiments.

In the embodiment where the counter is a pair of asynchronous up counters, the circuit also includes steering logic coupled to the trimming value input of the trimming signal generator. The steering logic selectively directs the pulses to one of the pair of asynchronous up counters depending on at least a sign bit of the trimming value presented on the trimming value input.

The circuit may also include a comparator coupled to compare a majority of bits of the pair of asynchronous up counters to each other. An equal output of the comparator is logically coupled to the trimmed PWM output.

More specifically, the main PWM signal generator includes a delayed output for generating a pulse a predetermined time after a rising edge of the main PWM output. Also, the PWM generation circuit includes a set-reset flip-flop having a set input, a reset input, and flip-flop output. The set input is coupled to the delayed output, the reset input is coupled to the equal output of the comparator and the flip-flop output comprises the trimmed output.

As a further enhancement to the PWM generation circuit, the main PWM signal generator, the trimming signal generator and the summer may be within a single integrated circuit, for example, an ASIC.

In accordance with another embodiment, the PWM generation circuit is in combination with a low-pass filter coupled to the trimmed PWM output. Accordingly, the low-pass filter provides an analog voltage output. Further, a voltage to current converter is attached to the analog voltage output of the low-pass filter such that a current output is produced which corresponds to the analog voltage output.

As yet another enhancement, the PWM generation circuit may be included within a process variable transmitter. This transmitter may include an analog output, at least one sensor, conditioning circuitry and a microprocessor. The microprocessor is coupled to the PWM generation circuit and the sensor. The trimmed PWM output of the PWM generation circuit is coupled through the conditioning circuitry to the analog output of the process variable transmitter. The conditioning circuitry may include a low-pass filter and a voltage-to-current converter such that the process variable transmitter may produce a current output.

Methods corresponding to the above-disclosed apparatus are also disclosed herein.

To briefly summarize, the present invention has several advantages and features associated with it. A PWM signal is selectively trimmed in accordance with a trimming value. Trimming may include shortening, lengthening, or preserving the original PWM signal. Thus, precise control of the PWM signal is facilitated, without requiring adjustment of the source of the PWM signal. Compensation of a PWM signal for various factors is thus facilitated, without the requirement to modify the original PWM value itself. This can be utilized in many applications including, for example, temperature compensation of a circuit used to generate an analog voltage output based upon a PWM signal. Advantageously, the microprocessor involved in such a circuit does not carry the burden of computing the temperature compensation function, as it is performable within the circuitry disclosed herein which may be implemented in, for example, an ASIC.

BRIEF DESCRIPTION OF THE DRAWINGS

The subject matter regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

DETAILED DESCRIPTION OF A PREFERRED EMBODIMENT

Figure 1:
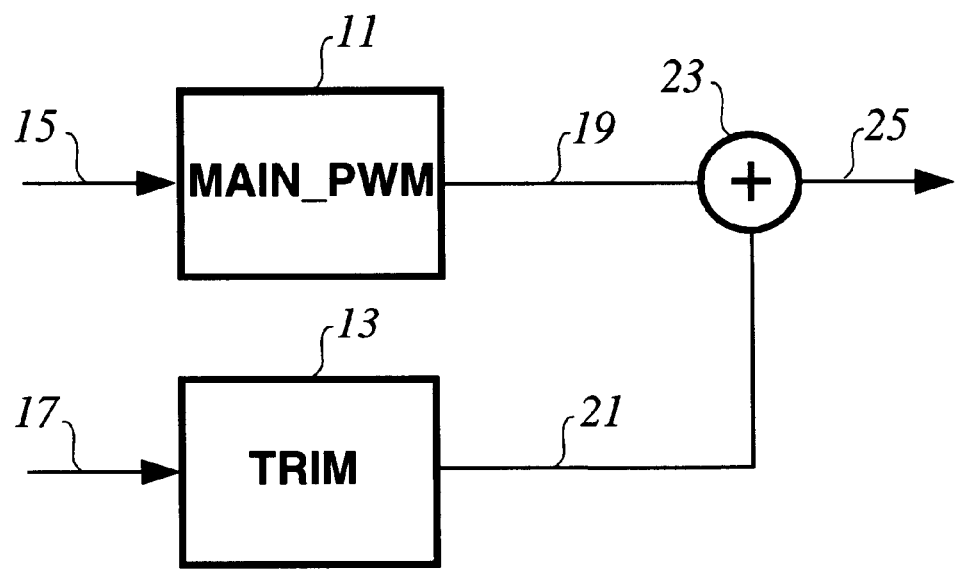
FIG. 1 depicts a PWM generation circuit with trimming capability pursuant to an embodiment of the present invention.

Beginning with FIG. 1, a PWM generation circuit is depicted according to one embodiment of the present invention. The circuit includes a main PWM generator 11, a trimming signal generator 13 and a summer 23. Main PWM generator 11 produces a main PWM signal 19 that is connected to an input of summer 23. Another input of summer 23 receives a trimming signal 21 generated by trimming signal generator 13. Summer 23 produces a trimmed PWM output 25 as a function of main PWM signal 19 and trimming signal 21. A PWM control value 15 and a trimming value 17 are respectively directed to each of main PWM generator 11 and trimming signal generator 13 in control thereof.

Figure 2:
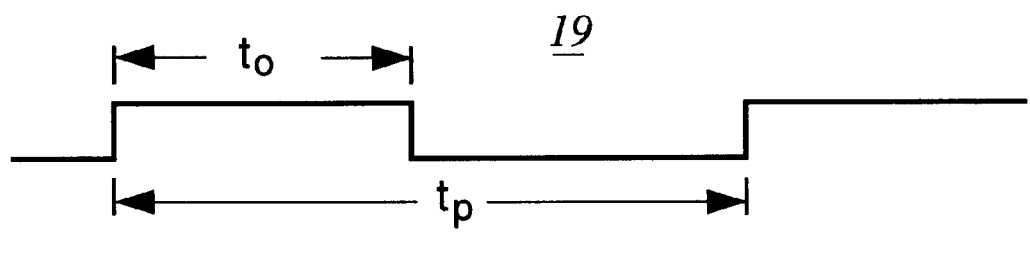
FIG. 2 depicts waveforms corresponding to the circuit of FIG. 1 according to an embodiment thereof.
Figure 2:
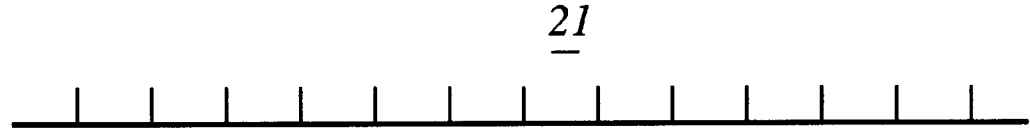
Figure 2:
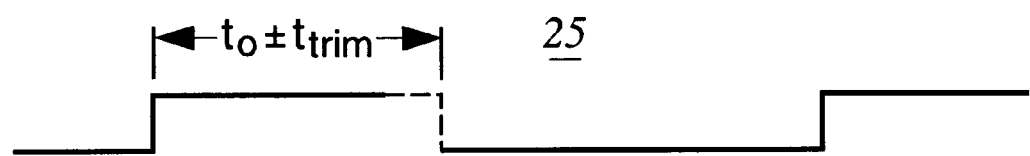

Several example signals from the circuit of FIG. 1 are depicted in FIG. 2. Firstly, main PWM signal 19 is depicted having period $t_p$ and on-time $t_o$. These time periods are controlled by data values presented to main PWM generator 11. For example, PWM control value 15 controls the duty cycle of main PWM signal 19.

To continue, trimming signal 21 consists of pulses at a selected frequency. The frequency of these pulses varies as a function of trimming value 17. A trimming valve of zero corresponds to no trimming pulses being produced. In the present embodiment, the width of each pulse is equal to one period of a master clock of the PWM generation circuit.

Trimmed PWM signal 25 is also depicted in FIG. 2. The frequency of trimmed PWM signal 25 is equal to that of main PWM signal 19. However, the duty-cycle thereof has been modified in accordance with trimming signal 21. The on-time of trimmed PWM signal 25 is a function of $t_o+t_{trim}$. In one embodiment (e.g., FIG. 6), the trimming time ($t_{trim}$) is equal to the total duration of pulses of trimming signal 21 occurring during the on-time of master PWM signal 19. In another embodiment (e.g., FIG. 8), adjusted PWM signal 25 may have a longer or shorter PWM on-time than main PWM signal 19 depending on trimming signal 21 (i.e., $t_{trim}$ may be positive or negative). Thus, summer 23 implements on integration-type function by accumulating trimming pulses and adding/subtracting the total time thereof to main PWM signal 19.

Figure 3:
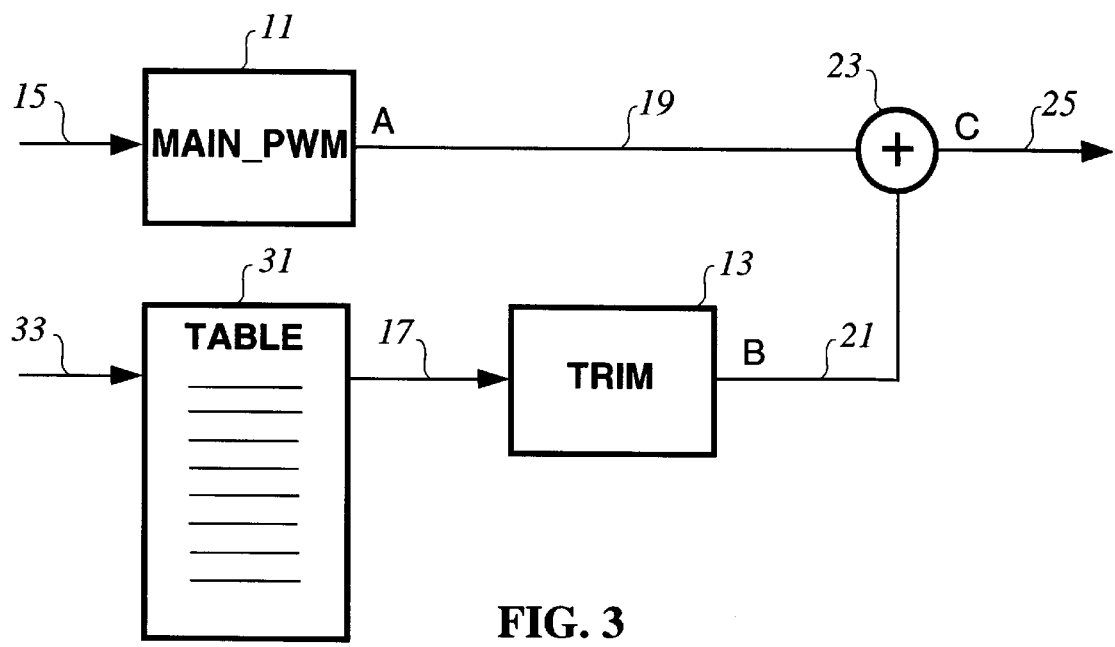
FIG. 3 depicts the PWM generation circuit of FIG. 1 in combination with a look-up table for trimming values in conformance with one embodiment of the present invention.

Depicted in FIG. 3 is an embodiment of the present invention similar to that depicted in FIG. 1; however, look-up table 31 has been added thereto. Look-up table 31 includes an index input 33 and a table data output coupled (either directly or through buffering/logic) to provide trimming value 17 to trimming signal generator 13. Look-up table 31 provides a definable correspondence between input values and trimming amounts. This facilitates, for example, introducing defined trimming amounts based upon a selected parameter, such as, for example, a measured physical property (e.g., temperature). Further, the introduction of a buffer on the output of table 31 facilitates, for example, reload of the table without disturbing the value currently in use by trimming signal generator 13.

Figure 4:
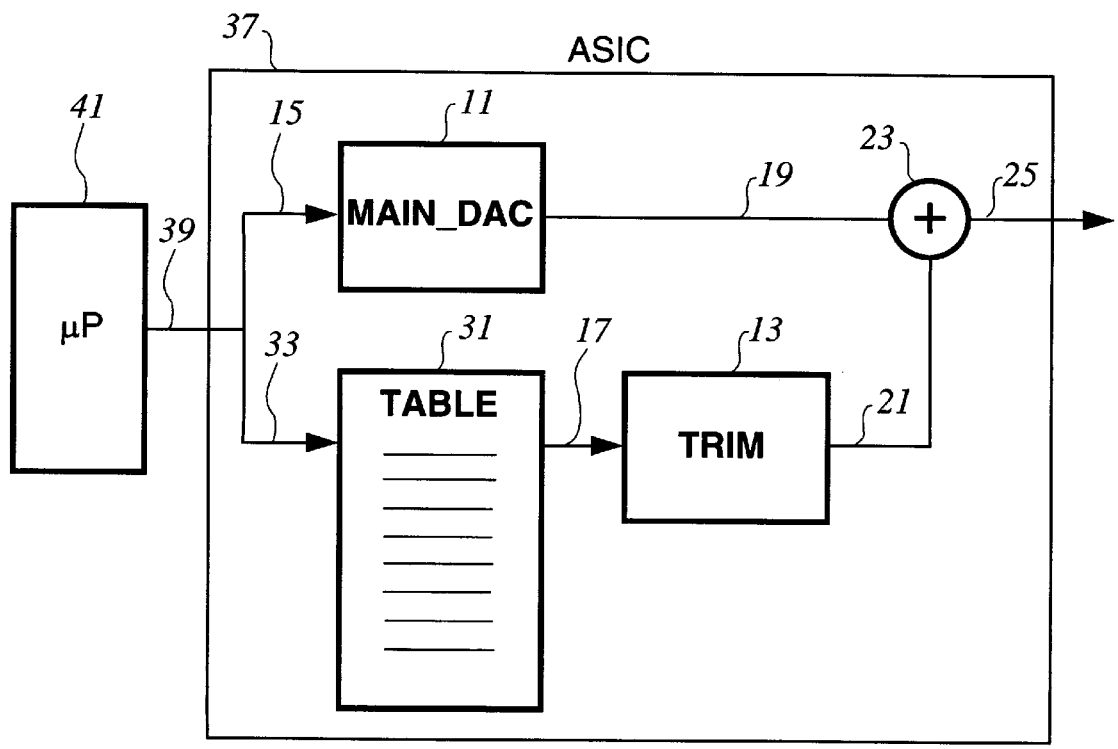
FIG. 4 depicts an ASIC-based embodiment of the circuit of FIG. 3 in combination with a microprocessor according to the present invention.

In the embodiment of FIG. 4, the circuitry of FIG. 3 has been implemented within an ASIC (Application Specific Integrated Circuit). Of course, other type of programmable/customizable logic can be similarly used to implement the requisite circuitry. Further, a microprocessor 41 is included in the circuit and is coupled to ASIC 37 through interface 39 (selected according to implementation requirements, e.g., parallel or serial). Microprocessor 41 utilizes the trimmed PWM signal generating ability implemented within the ASIC 37.

Figure 5:
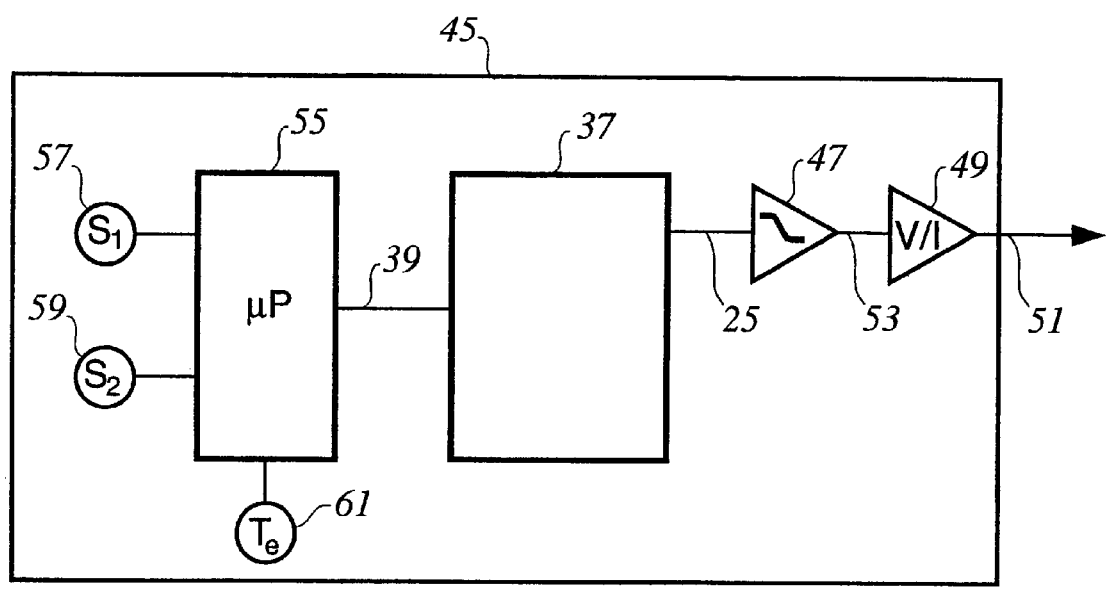
FIG. 5 depicts a process variable transmitter utilizing the PWM generation circuit disclosed herein pursuant to an embodiment of the present invention.

FIG. 5 depicts a process variable transmitter 45 according to an embodiment of the present invention. Transmitter 45 includes a first process sensor $S_1$ 57, a second process sensor $S_2$ 59, and an electronics temperature sensor $T_e$ 61. Further, transmitter 45 includes a microprocessor 55 attached to sensors 57, 59 and 61 (through A/D circuitry), and to trimmed PWM generator 37. PWM output 25 (of trimmed PWM generator 37) is sequentially passed through analog conditioning circuitry including a low-pass filter 47 and a voltage-to-current converter 49 to provide a, e.g., industry standard 4–20 ma signal output.

Operationally, transmitter 45 reads sensor information, and provides a corresponding analog output 51. For example, first process sensor $S_1$ 57 may comprise a pressure sensor and second process sensor $S_2$ 59 may comprise a temperature sensor. In this embodiment, analog output 51 may represent a process pressure. This output signal is compensated for process temperature effects on the pressure sensor using the sensed process temperature. Further, temperature induced drift in analog output 51 can also be compensated for by sensing the electronics temperature using sensor $T_e$ 61. More particularly, for example, the trimming of the output may be performed using the trimming feature of trimmed PWM generator 37. A trimming value determined as a function of process and electronics temperature (through empirical calibration procedures) is applied to generator 37 which trims the pressure dependent output accordingly. Processor 55 is thereby relieved of several aspects of temperature compensation.

To further explain, table 31 is used to provide trim values for analog output 51 based on the temperature of electronics 61. The electronics temperature value is used to index trim table 31. The output of the trim table is the value used to trim the analog output 51. This reduces the burden on the processor 55 since the processor need only provide an index to a table rather than compute the trim value. If table 31 is large enough, the actual integer temperature valve (e.g., 0–100° C.) could be used as the index to table 31.

In one embodiment, table 31 may have a restricted number of entries (for example, 8 entries). Accordingly, one technique for determining index input 33 is based on the electronics temperature 61 in degrees F and an offset. Specifically, the following manipulation is used to determine index input 33.

Index=((Temp+Offset)AND E0/h)/10/h.

The arithmetic sum of the temperature add offset (i.e., lower temperature limit) is ANDed with the size of each temperature range and then masked with the number of bits of the table to determine the index. This same approach can be used to create indexes of any binary size. i.e. 2,4,8,16.). The actual table valves would be determined empirically for each index/temperature range.

As one example, this manipulation will result in the following implementation:

index=((Temp+40 degF)AND E0/h)10/h

| Temperature (deg F.) | Index |
|---|---|
| −40 to −8 | 0 |
| −8 to 24 | 1 |
| 24 to 56 | 2 |
| 56 to 88 | 3 |
| 88 to 120 | 4 |
| 120 to 152 | 5 |
| 152 to 184 | 6 |
| 184 to 215 | 7 |

Additionally, the table can be used as a cache, in that the table can contain a section of a larger table. The processor would reload the table as the index moved to the end of the table. Buffer 109 would allow this reload process to not effect the trim value until the process is complete. The index equation would then use a new offset value (new lower temperature value for the current table entries).

Figure 6:
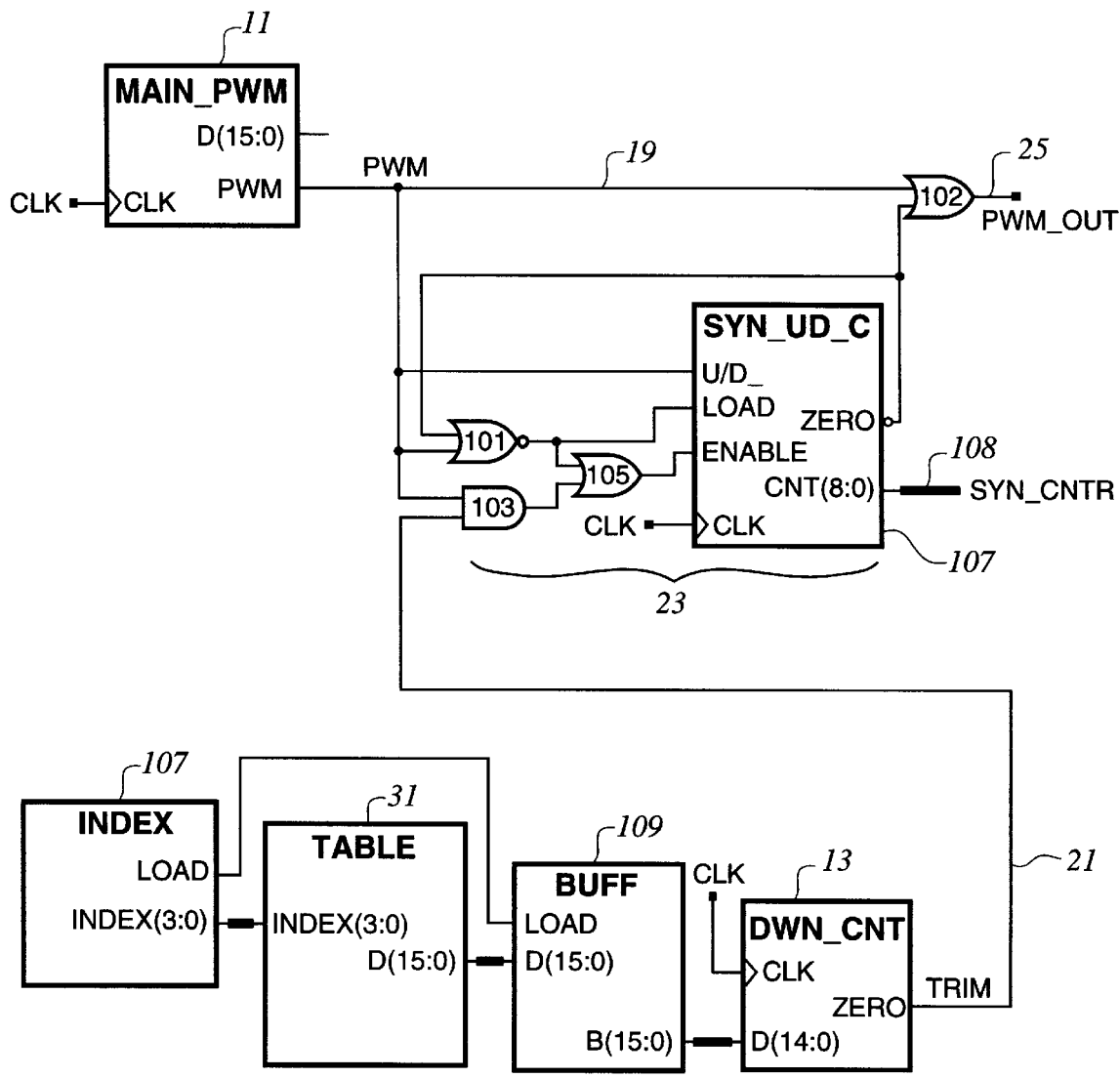
FIGS. 6, 8 and 10 depict embodiments of summer related circuitry in accordance with the present invention.
Figure 7:
FIGS. 7, 9 and 11 depict waveforms corresponding to the circuits of FIGS. 6, 8 and 10, respectively.
Figure 9:
Figure 11:
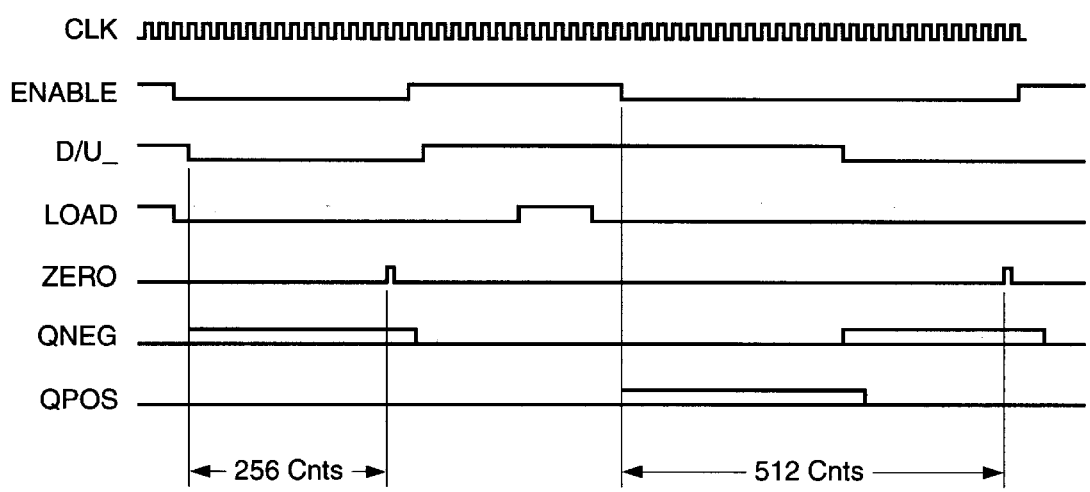
Figure 8:
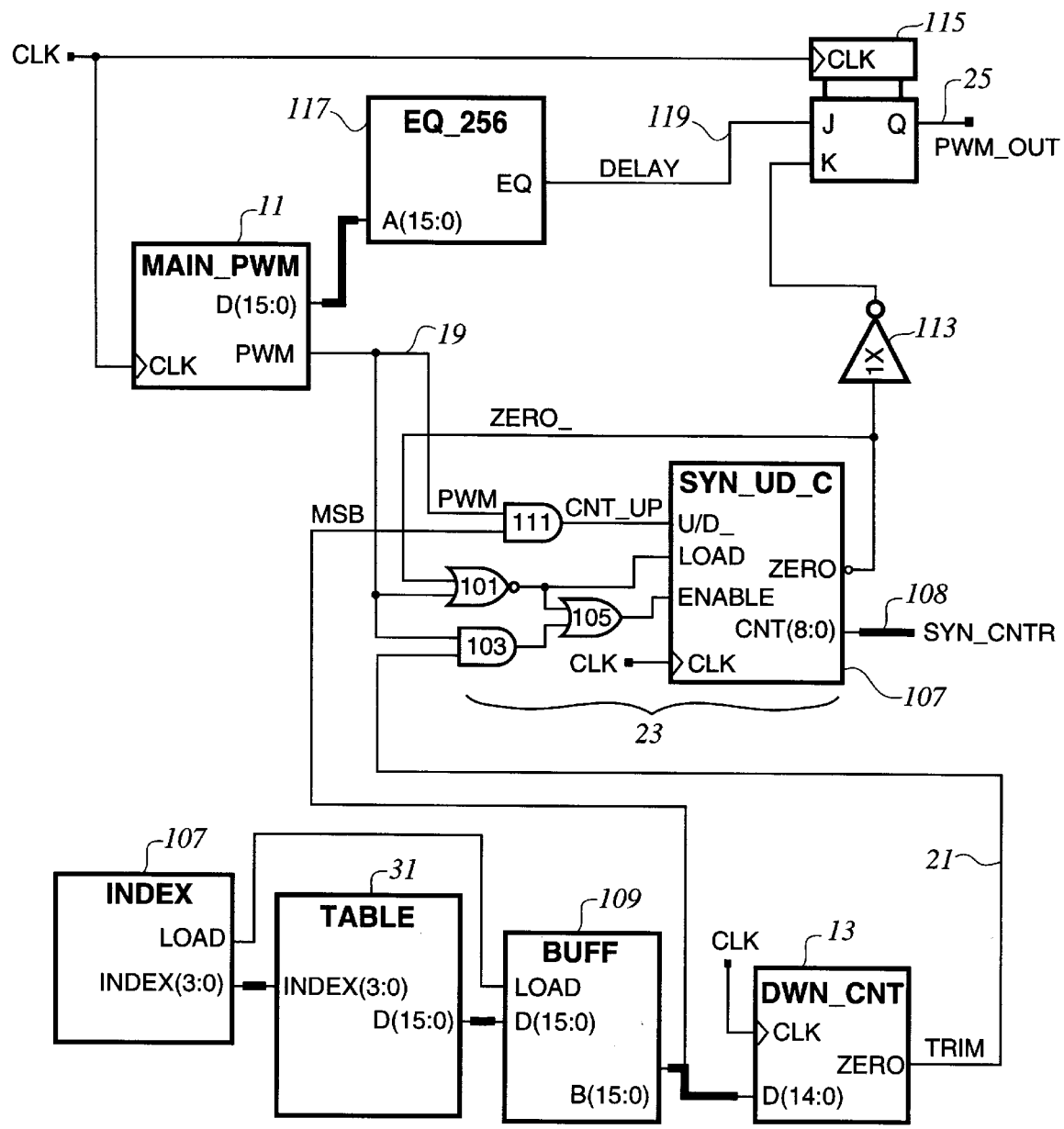
Figure 10:
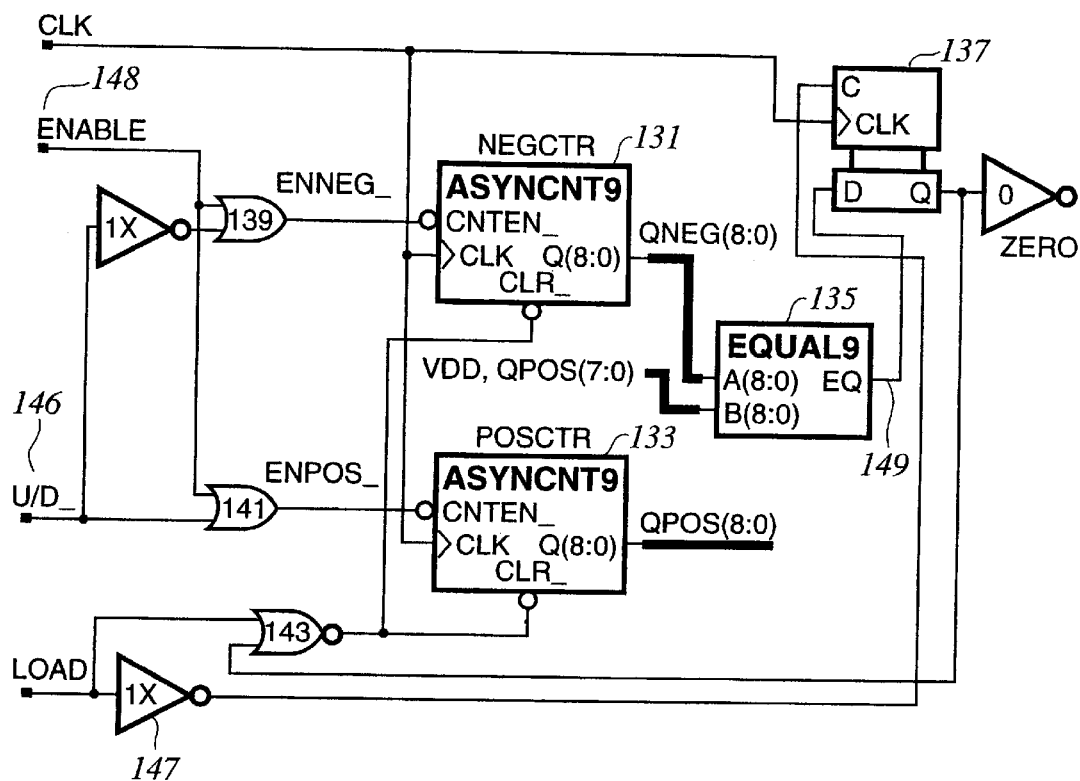

Several embodiments of circuitry used within trimmed PWM generator 37 are depicted in FIGS. 6, 8 & 10. During the below discussion, reference should be made to the accompanying timing diagrams for each of FIGS. 6, 8 & 10, that is FIGS. 7, 9 & 11, respectively.

Beginning with FIG. 6, a circuit is depicted that will output trimmed PWM signal 25 having an on-time based upon the length of main PWM signal 19 increased as a function of trimming signal 21. The circuit is driven by a common clock signal CLK. Main PWM signal generator 11 produces main PWM signal 19 which is connected to an OR gate 102 and a summer subcircuit 23. The connection to OR gate 102 facilitates trimmed PWM output 25 being high whenever main PWM signal 19 is high. The other input of OR gate 102 is connected to summer circuit 23 and facilitates the extension of the high time of trimmed PWM output 25.

Trimming signal generator 13 is implemented as a down counter. Trimming signal 21 is the zero output of the down counter and is coupled to summer 23. Thus, a trimming pulse is generated each time the down counter reaches zero. Trimming signal generator 13 is loaded with a trimming value from a buffer 109 that receives its input from table 31. This buffer facilitates, for example, reloading of table 31 while the circuit continues uninterrupted operation. An index register 107 provides an index input to table 31.

Summer 23 is implemented as a combination of gates 101, 103 & 105 and a synchronous up-counter 107 (the LOAD input of counter 107 is configured to clear the counter, i.e., a load of zero). The logic is configured such that during the on-time of main PWM signal 19, the counter increments with each trimming pulse (signal 21). When main PWM signal is low, and counter 107 is non-zero, counter 107 decrements upon each clock pulse until zero is reached. During the time the counter is non-zero, trimmed PWM signal 25 is high (through the use of OR gate 102). Thus, by way of the above operation, the main PWM signal is extended and output as trimmed PWM output 25.

In some implementations, it may be desirable to either lengthen or shorten main PWM signal 19 by way of trimming. Accordingly, depicted in FIG. 8 is circuitry used to extend or shorten the on-time of the main PWM signal 19 and output it as the trimmed PWM signal 25. This circuit is similar to that of FIG. 7, but has been modified to facilitate both shortening and extending of main PWM signal 19.

In this embodiment, trimmed PWM signal 25 is generated by a JK flip-flop 115 that is set from delay signal 119 and reset by the a signal from counter 107 (as inverted by inverter 113). A comparator 117 (comparing to 256) generates delay signal 119, 256 clock cycles after the rising edge of main PWM signal 19. Also, counter 107 (9 bit counter) is preloaded with 256 by the LOAD signal.

Gates 101, 103, 105 and 111 are configured with counter 107 to generate the reset signal connected to flip-flop 115 up to 512 clock cycles after the falling edge of main PWM signal 19. Accordingly, as determined by the selected trimming value, trimmed PWM signal 25 may have an on-time 256 clock cycles longer or shorter than main PWM signal 19. Thus, trimmed PWM signal 25 is shortened or extended with respect to main PWM signal 19. The MSB from buffer 109 is a sign bit and governs which direction counter 107 will count.

As one operational example, if a particular trimming value resulted in counter 107 accumulating 256 counts during the on-time of main PWM signal 19, it would take 256 additional clock cycles for counter 107 to reach zero. Thus, trimmed PWM signal 25 would have the same on-time as main PWM signal 19. Lower trimming values than that used in the above example would result in trimmed PWM signal 25 having a shorter on-time than main PWM signal 19. Contrarily, higher trimming values than that used in the above example would result in trimmed PWM signal 25 having a shorter on-time than main PWM signal 19.

In the embodiments of FIGS. 7 & 9, a synchronous up/down counter 107 is used in the implementation of summer circuit 23. In some applications, it may be more advantageous to use other types of counters. For example, asynchronous up-counters have lower power consumption and use fewer gates than synchronous up/down counters.

Thus, for example, in an ASIC implementation, it would be desirable to use asynchronous up-counters to save available gates. Also, lower power consumption is a benefit in implementations with a limited power budget such as, for example, a process variable transmitter (e.g., FIG. 5).

In view of the above, FIG. 10 depicts a circuit that is functionally equivalent to synchronous up/down counter 107 and may be substituted therefor. The most significant bit (MSB) from buffer 109 is the sign bit.

The sign bit is used to determine which counter is to count. When the U/D signal 146 is high (1) the positive counter 133 will count. When the U/D signal 146 is low (0) the negative counter 131 will count. When the enable signal 148 goes low (0) only the negative counter 131 counts. When the enable signal 148 goes low (0) the negative counter will count up to the value in the positive count +256. At that point the compare circuit 135 will assert the EQ signal 149 high (1). The EQ signal 149 will be captured by the flip-flop 137. This event will clear the both the negative counter 131 and the positive counter 133 arming them for the next cycle.

The present invention has several advantages and features associated with it Methods corresponding to the above-disclosed apparatus are also described. To briefly summarize, the present invention has several advantages and features associated with it. A PWM signal is selectively trimmed in accordance with a trimming value. Trimming may include shortening, lengthening, or preserving the original PWM signal. Thus, precise control of the PWM signal is facilitated, without requiring adjustment of the source of the PWM signal. Compensation of a PWM signal for various factors is thus facilitated, without the requirement to modify the original PWM value itself. This can be utilized in many applications including, for example, temperature compensation of a circuit used to generate an analog output based upon a PWM signal. Advantageously, the microprocessor involved in such a circuit does not carry the burden of computing the temperature compensation function, as it is performable within the circuitry disclosed herein which may be implemented in, for example, an ASIC.

While the invention has been described in detail herein, in accordance with certain preferred embodiments thereof, many modifications and changes thereto may be affected by those skilled in the art. Accordingly, it is intended by the appended claims to cover all such modifications and changes as fall within the true spirit and scope of the invention.

What is claimed is:

1. A PWM ("pulse width modulation") generation circuit comprising:
   a main PWM signal generator having a main PWM output;
   a trimming signal generator having a trimming output, said trimming output producing pulses;
   a summer having a first input, a second input and a trimmed PWM output, said first input being connected to said main PWM output, and said second input being connected to said trimming output, wherein said trimmed PWM output has a duty cycle of said main PWM output modified as a function of said trimming output;
   a low-pass filter coupled to said trimmed PWM output, wherein said low-pass filter provides an analog voltage output; and
   a voltage to current converter having a voltage input, said voltage input coupled to said analog voltage output of said low-pass filter, wherein said voltage to current converter provides a current output corresponding to said analog voltage output.

2. The PWM generation circuit of claim 1, wherein said trimming signal generator includes a trimming value input for receiving a trimming value, wherein a frequency of said pulses is a function of said trimming value.

3. The PWM generation circuit of claim 2, wherein said trimming value is a function of a measured parameter.

4. The PWM generation circuit of claim 3, wherein said measured parameter comprises temperature.

5. The PWM generation circuit of claim 2, further comprising a lookup table having an index input and a table data output, said table data output being coupled to said trimming value input, wherein said lookup table controls said trimming signal generator as a function of data on said index input and contents of said lookup table.

6. The PWM generation circuit of claim 5, further including a buffer coupling said table data output of said lookup table to said trimming value input of said trimming signal generator.

7. The PWM generation circuit of claim 1, wherein said summer at least one of extends, preserves and shortens said duty cycle of said main PWM output in generating said trimmed PWM output.

8. The PWM generation circuit of claim 7, wherein said summer includes at least one counter logically coupled to said trimming output, said main PWM output and said trimmed PWM output such that said counter records said pulses during an on-time of said main PWM output, thereby controlling said one of extending, preserving and shortening said trimmed PWM output.

9. The PWM generation circuit of claim 8, wherein said at least one counter comprises a synchronous up/down counter.

10. The PWM generation circuit of claim 1, wherein said main PWM signal generator, said trimming signal generator and said summer are within a single integrated circuit.

11. The PWM generation circuit of claim 10, wherein said single integrated circuit comprises an Application Specific Integrated Circuit ("ASIC").

12. The PWM generation circuit of claim 1, wherein said PWM generation circuit in included within a process variable transmitter including a current output, at least one sensor, conditioning circuitry and a microprocessor, said microprocessor being coupled to said PWM generation circuit and said at least one sensor, wherein said analog voltage output of said PWM generation circuit is coupled through said conditioning circuitry to said current output of said process variable transmitter.

13. A method of generating a trimmed PWM signal in a PWM generation circuit comprising:
   generating a main PWM signal,
   generating a trimming signal,
   in response to said main PWM signal and said trimming signal, generating a trimmed PWM signal comprising said main PWM signal with its duty cycle modified as a function of said trimming signal;
   wherein said circuit further includes a low-pass filter, and wherein said method further comprises routing said trimmed PWM signal through said low-pass filter to providing an analog voltage on an output thereof; and
   wherein said circuit further includes a voltage to current converter, and wherein said method further comprises routing said analog voltage through said voltage-to-current converter to produce a current output.

14. The method of claim 13, wherein said trimming signal is generated using a trimming signal generator including a trimming value input, and wherein said method further comprises setting a trimming value on said trimming value input, and wherein said generating said trimming signal comprises generating pulses having a frequency as a function of said trimming value.

15. The method of claim 14, further comprising measuring a physical parameter, and determining said trimming value as a function of said physical parameter.

16. The method of claim 15, wherein said measuring said physical parameter comprises measuring a temperature.

17. The method of claim 14, wherein said circuit further comprises a lookup table having an index input and a table data output, said table data output being coupled to said trimming value input, and wherein said method further comprises, in response to data presented on said index input, looking up a corresponding value in said lookup table and presenting said corresponding value on said table data output, thereby loading said trimming value input therewith.

18. The method of claim 17, wherein said circuit further includes a buffer coupling said table data output of said lookup table to said trimming value input of said trimming signal generator, and wherein said method includes latching data within said buffer as it passed from said lookup table to said trimming signal generator.

19. The method of claim 13, wherein said generating said trimmed PWM signal comprises at least one of extending, shortening and preserving said duty cycle of said main PWM signal.

20. The method of claim 19, wherein said method further comprises counting pulses of said main PWM signal during an on-time of said main PWM signal, said at least one of extending, shortening and preserving said duty cycle of said main signal being proportional to a number of said counted pulses.

21. The method of claim 20, wherein said counting is performed using at least one synchronous up/down counter.

22. The method of claim 13, wherein said generating said main PWM signal is performed as a function of a measured process variable, and wherein said generating said trimming signal is performed as a function of a measured parameter.

23. The method of claim 22, further comprising passing said trimmed PWM output through conditioning circuitry and to an analog output.

24. The method of claim 22, wherein said measured parameter comprises a temperature of said conditioning circuitry.

* * * * *